(12) United States Patent
Clark et al.

(10) Patent No.: US 7,964,515 B2
(45) Date of Patent: Jun. 21, 2011

(54) METHOD OF FORMING HIGH-DIELECTRIC CONSTANT FILMS FOR SEMICONDUCTOR DEVICES

(75) Inventors: Robert D. Clark, Livermore, CA (US); Cory Wajda, Sand Lake, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 11/963,150

(22) Filed: Dec. 21, 2007

(65) Prior Publication Data
US 2009/0163012 A1  Jun. 25, 2009

(51) Int. Cl.
*H01L 21/31* (2006.01)
*H01L 21/469* (2006.01)
*C23C 14/00* (2006.01)
*C23C 16/00* (2006.01)

(52) U.S. Cl. . 438/770; 438/591; 438/785; 257/E21.283; 427/249.15; 427/249.17; 427/255.19; 427/255.26

(58) Field of Classification Search .................. 438/591, 438/785; 257/E21.283; 427/249.15, 249.17, 427/255.19, 255.26
See application file for complete search history.

(56) References Cited

U.S. PATENT DOCUMENTS

| | | | |
|---|---|---|---|
| 6,548,424 B2 * | 4/2003 | Putkonen ...................... | 438/785 |
| 6,858,546 B2 | 2/2005 | Niinisto et al. | |
| 6,858,547 B2 | 2/2005 | Metzner et al. | |
| 6,884,685 B2 | 4/2005 | Luo et al. | |
| 7,205,247 B2 | 4/2007 | Lee et al. | |
| 7,304,004 B2 | 12/2007 | Metzner et al. | |
| 2003/0031793 A1 | 2/2003 | Chang et al. | |
| 2003/0194853 A1 | 10/2003 | Jeon | |
| 2004/0198069 A1 | 10/2004 | Metzner et al. | |
| 2005/0056219 A1 * | 3/2005 | Dip et al. ....................... | 118/722 |
| 2005/0233156 A1 | 10/2005 | Sensaki et al. | |
| 2005/0235905 A1 * | 10/2005 | Senzaki et al. ................... | 117/88 |
| 2006/0040483 A1 * | 2/2006 | Niimi et al. .................... | 438/591 |
| 2006/0068603 A1 | 3/2006 | Wajda | |
| 2006/0133955 A1 | 6/2006 | Peters | |
| 2006/0156979 A1 | 7/2006 | Thakur et al. | |
| 2007/0026540 A1 * | 2/2007 | Nooten et al. ..................... | 438/5 |
| 2007/0037412 A1 | 2/2007 | Dip et al. | |
| 2007/0072363 A1 * | 3/2007 | Visokay et al. ............... | 438/240 |

(Continued)

FOREIGN PATENT DOCUMENTS
EP  20021205574 A2  5/2002
(Continued)

OTHER PUBLICATIONS
Liu et al., ALD of Hafnium Oxide Thin Films from Tetrakis(ethylmethylamino)hafnium and Ozone, Journal of The Electrochem. Soc., 2005, 152(3), pp. G213-G219.
(Continued)

*Primary Examiner* — Zandra Smith
*Assistant Examiner* — Jeremy J Joy (57) ABSTRACT

A method is provided for forming high dielectric constant (high-k) films for semiconductor devices. According to one embodiment, a metal-carbon-oxygen high-k film is deposited by alternately and sequentially exposing a substrate to a metal-carbon precursor and near saturation exposure level of an oxidation source containing ozone. The method is capable of forming a metal-carbon-oxygen high-k film with good thickness uniformity while impeding growth of an interface layer between the metal-carbon-oxygen high-k film and the substrate. According to one embodiment, the metal-carbon-oxygen high-k film may be treated with an oxidation process to remove carbon from the film.

17 Claims, 7 Drawing Sheets

U.S. PATENT DOCUMENTS

2007/0237697 A1 10/2007 Clark
2008/0096394 A1* 4/2008 Chen et al. .................. 438/758
2008/0233288 A1 9/2008 Clark

FOREIGN PATENT DOCUMENTS

| WO | 03035926 A2 | 5/2003 |
| WO | 2005050715 A2 | 4/2005 |
| WO | 2005113855 A1 | 12/2005 |

OTHER PUBLICATIONS

Myllymaki et al., High-Permittivity YScO3 thin films by atomic layer deposition using two precursor approaches, Journal of Materials Chemistry, 2006, 16, pp. 563-569.

Kawahara et al., Effects of Hf Sources, Oxidizing Agents, and NH3 Radicals on Properties of HfAlOx films Prepared by Atomic Layer Deposition, IWGI, 2003, pp. 32-37, Piscataway, NJ.

* cited by examiner

METHOD OF FORMING HIGH-DIELECTRIC CONSTANT FILMS FOR SEMICONDUCTOR DEVICES

FIELD OF INVENTION

The present invention relates generally to the field of forming high dielectric constant (high-k) films for semiconductor devices and more particularly to methods for forming high-k films with good thickness uniformity on substrates while impeding oxidation of the substrates.

BACKGROUND OF THE INVENTION

In microelectronics, continuous shrinking of devices is necessary to improve the performance, which sets challenging requirements for fabrication of integrated circuits (ICs). New manufacturing techniques are required for growing very thin blanket films and thin films covering deep trenches and other three dimensional (3D) structures with good conformality. Atomic layer deposition (ALD) has gathered interest in the microelectronic industry from the unique characteristics that the method offers: ultra-thin films can be deposited on large substrates with excellent conformality and with control of thickness and composition at the nanometer level. ALD has high potential for use in microelectronics for high-k film growth for complementary metal oxide semiconductor (CMOS) devices and dynamic random access memory (DRAM) capacitors as well as for ferroelectrics, barrier materials, and conductors such as metal gates.

High-k materials have been extensively studied due to the fact that $SiO_2$, which is traditionally used as a gate oxide in metal-oxide semiconductor field effect transistors (MOSFETs), can no longer function as an effective gate insulator as higher capacitance density with decreased gate oxide thickness is required for near-future device generations. High-k materials usually refer to materials having a dielectric constant greater than $SiO_2$ (k=3.9). Silicon oxynitride, $SiO_xN_y$, has been used to extend the use of silicon oxide-based gate dielectrics but a long term alternative solution is required. Many high-k materials under evaluation suffer from various problems, including film crystallization during anneals, growth of interface layers during film deposition and further processing, large densities of interface traps, reduced channel mobility, reaction with poly-silicon (poly-Si) gates, and Fermi level pinning with metal gate electrodes. Other problems encountered with many high-k materials include dielectric constants that are too low compared to desired values for advanced semiconductor devices. The dielectric constant of a film stack containing a high-k film may be further reduced by the presence of an interface layer between the high-k material and the underlying substrate. Accordingly, further developments for forming high-k materials are needed to solve these and other problems of prior art high-k materials.

SUMMARY OF THE INVENTION

A method is provided for forming high dielectric constant (high-k) films for semiconductor devices using a film deposition sequence that includes exposing a substrate to temporally separated and alternating reactant pulses. According to one embodiment, the substrate is maintained at a temperature suitable for atomic layer deposition (ALD). According to another embodiment, the substrate can be maintained at a temperature below which is suitable for ALD. The method is capable of forming a high-k film with good thickness uniformity while impeding growth of an interface layer between the high-k film and the substrate. According to embodiments of the invention, the deposited high-k film may be treated with an oxidation process to improve the material and electrical properties of the film.

According to one embodiment of the invention, a method is provided for forming a metal-carbon-oxygen high-k film for a semiconductor device. The method includes disposing a substrate in a process chamber and providing a film deposition sequence of a first reactant containing a metal-carbon precursor and a second reactant containing ozone in temporally separated and alternating reactant pulses. The method further includes selecting a first reactant exposure that achieves self-saturation of the metal-carbon precursor on a surface of the substrate, selecting a second reactant exposure that is between below self-saturation and three hundred (300) percent self-saturation of ozone reacting with the self-saturated metal-carbon precursor on the surface of the substrate, and exposing the substrate to the sequence of the reactant pulses with the selected temporal separations and exposures to deposit a metal-carbon-oxygen high-k film on the substrate. According to one embodiment of the invention, following deposition of the metal-carbon-oxygen high-k film, the film may be treated with an oxidation process to effectively remove carbon and other impurities from the metal-carbon-oxygen high-k film without significantly increasing a thickness of an interface layer between the metal-carbon-oxygen high-k film and the substrate.

DETAILED DESCRIPTION OF SEVERAL EMBODIMENTS

Methods for depositing high-k films for semiconductor devices using a film deposition sequence that include exposing a substrate to temporally separated and alternating reactant pulses is described in various embodiments. One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Furthermore, it is understood that the various embodiments shown in the figures are illustrative representations and are not necessarily drawn to scale.

Reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention.

There is a general need for new methods that provide flexibility for depositing high-k films with tailored material and electrical properties for advanced semiconductor devices. ALD can meet this need by depositing a wide variety of high-k films such as metal oxides, metal oxynitrides, metal silicates, and metal silicon oxynitrides for fabrication of advanced ICs. These high-k films can be used as gate dielectric films in MOSFETs and capacitors of DRAM devices, for example deep trench DRAM structures or stacked DRAM structures. In a deep trench DRAM structure, a capacitor may be built into a high aspect ratio (depth/width) trench etched into a semiconductor substrate. The aspect ratio of the deep trench can, for example, be between about 25 and about 60, which can benefit from highly conformal deposition provided by ALD.

ALD is a variant of chemical vapor deposition (CVD), but unlike CVD, ALD relies on sequential and saturating surface reactions of alternately applied reactant pulses. Film growth proceeds in a cyclic manner, thereby enabling easy film thickness control. For deposition of a metal-containing high-k film, the metal precursor should be sufficiently volatile and not undergo significant decomposition at the deposition temperature. Furthermore, the metal precursor should react with surface sites on a substrate and subsequently have sufficient reactivity towards an oxidation source to form the desired high-k film.

Ozone ($O_3$) is a strong oxidation source and is highly volatile, which makes it one of the most promising oxidation sources to replace or supplement the use of water ($H_2O$) in ALD processing. Other advantages of using ozone over water include reduced gas phase reactions, shorter process chamber purge times and therefore higher manufacturing throughput. In a conventional ALD process, very high ozone exposures are commonly utilized to ensure saturated film growth and provide efficient removal of carbon and other impurities from the films. These very high ozone exposures are often several orders of magnitude above self-saturation of ozone reacting with a metal-containing precursor adsorbed on a surface of the substrate.

The current inventors have realized that there are also several disadvantages associated with using very high ozone exposures in ALD processing of high-k films for semiconductor device applications. For example, once an ozone saturation exposure is reached in an ALD step, film uniformity across a substrate surface may degrade with higher ozone exposures. Furthermore, ozone exposures used in formation of high-k films by ALD processing can be a key factor in determining the electrical properties of the high-k films and semiconductor devices containing the high-k films. For example, since many high-k films used in advanced semiconductor devices are very thin (e.g., have a thickness of about 2-5 nm in gate dielectric applications) and these films can be highly transparent to oxygen diffusion from the processing environment through the high-k film to the underlying substrate, interaction of the high-k films with ozone has been observed to quickly form and/or increase the thickness of an interface layer (e.g., $SiO_2$) located between the high-k film and the substrate (e.g., Si).

It is well known to those skilled in the art, that the presence of an interface layer that is more than a few angstrom thick is detrimental to the electrical properties of a semiconductor device such as a gate stack since the interface layer has a lower dielectric constant than the high-k film and can significantly add to the equivalent oxide thickness (EOT) of the gate stack. EOT is a number that is frequently used to compare performance of high-k based MOS devices with the performance of $SiO_2$ based MOS devices, where EOT represents the thickness of a $SiO_2$ gate dielectric film needed to obtain the same gate capacitance as a thicker high-k film.

Embodiments of the invention provide a method for forming high quality metal-carbon-oxygen high-k films with good electrical properties and good thickness uniformity across large substrates (e.g., 300 mm or larger Si wafers). Embodiments of the invention utilize low ozone exposures for metal-carbon-oxygen high-k film deposition that are significantly lower than those currently used in semiconductor manufacturing. The advantages and benefits of depositing metal-carbon-oxygen high-k films using low ozone exposures and integrating these films into semiconductor manufacturing have not been reported. Embodiments of the invention utilize ozone exposures that achieve between below self-saturation and about 300 percent (%) self-saturation of ozone reacting with a metal-carbon precursor adsorbed on a surface of the substrate. For example, the below self-saturation of ozone can be 70, 75, 80, 85, 90, or 95% ozone self-saturation. In one example, the below self-saturation of ozone can be between 70% and 95% self-saturation of ozone. Other examples include between 70% and about 300%, or between 70% and about 200%, or between 70% and about 150% self-saturation of ozone. The low ozone exposures impede the growth of an interface layer between the metal-carbon-oxygen high-k film and the substrate compared to the very high ozone exposures used in conventional deposition of high-k films by ALD. As used herein, a metal-carbon precursor contains a metal atom and carbon-containing ligands attached to the metal atom, and a metal-carbon-oxygen high-k film contains metal and carbon atoms from the metal-carbon precursor and oxygen from an oxidation process.

The near ozone self-saturation can result in significant incorporation of carbon (C) and other impurities from the metal-carbon precursor into the metal-carbon-oxygen high-k film. This is due to reduced removal of carbon and other impurities from the metal-carbon-oxygen high-k film when compared to the very high ozone exposures conventionally utilized to ensure saturated film growth and provide efficient removal of carbon and other impurities from the films. In one example, the carbon-content of an as-deposited hafnium-carbon-oxygen film was between 4 and 6 atomic percent carbon.

According to one embodiment of the invention, following deposition of the metal-carbon-oxygen high-k film, the film may be treated with an oxidation process to effectively remove carbon and other impurities from the metal-carbon-oxygen high-k film without significantly increasing the thickness of the interface layer formed between the metal-carbon-oxygen high-k film and the substrate. This further processing reduces electrical leakage through the metal-carbon-oxygen high-k film when incorporated into a gate stack of a semiconductor device. According to one embodiment of the invention, the oxidation process can include exposing the metal-carbon-oxygen high-k film to a flow of $O_2$ gas excited by ultra-violet radiation to reduce the carbon-content of the metal-carbon-oxygen high-k film. According to another embodiment of the invention, the oxidation process can include exposing the metal-carbon-oxygen high-k film to a process gas containing $O_2$ gas excited by plasma induced dissociation based on microwave irradiation via a plane antenna member having a plurality of slots to reduce the carbon-content of the metal-carbon-oxygen high-k film. Both these oxidation processes provide low energy oxidation of the metal-carbon-oxygen high-k film, while minimizing growth of an interface layer between the metal-carbon-oxygen high-k film and the substrate.

According to another embodiment of the invention, a metal-carbon-oxygen high-k film may be deposited using temporally separated and alternating reactant pulses as described above for ALD processing but at a substrate temperature below which ALD processing is normally carried out. Metal-carbon-oxygen high-k films deposited at such low substrate temperatures often contain large amounts of carbon and other impurities due to incomplete decomposition of the metal-carbon precursors on a surface of the substrate. According to one embodiment of the invention, the metal-carbon-oxygen high-k film may be further processed by exposure to an UV-assisted $O_2$ oxidation process or exposure to a process gas containing $O_2$ gas excited by plasma induced dissociation based on microwave irradiation via a plane antenna member having a plurality of slots as described above for an ALD process.

Figure 1A:
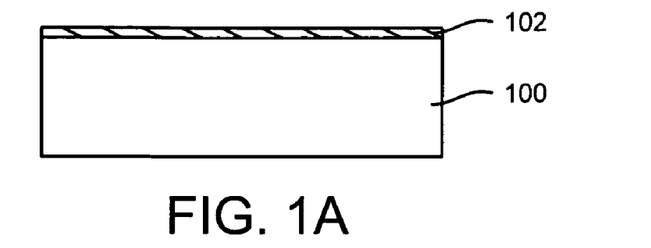
FIGS. 1A-1C depict formation of a semiconductor device according to an embodiment of the invention.
Figure 1B:
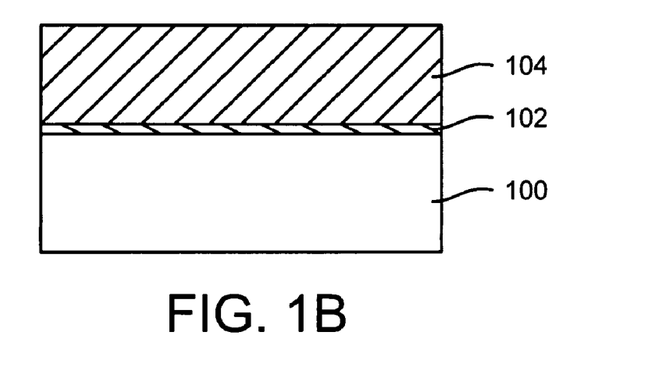
Figure 1C:
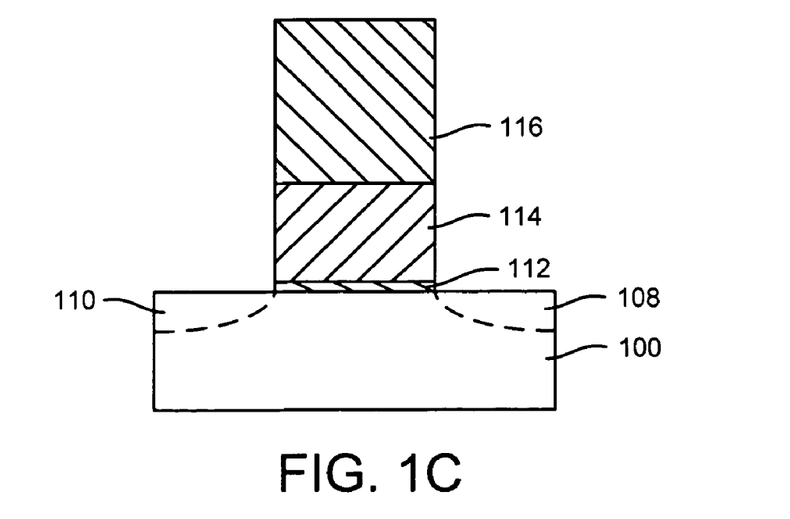

Referring now to the drawings, FIGS. 1A-1C depict formation of a semiconductor device according to an embodiment of the invention. FIG. 1A schematically shows a cross-sectional view of a substrate 100 containing an interface layer 102. The substrate 100 can, for example, be a Si, Ge, SiGe, or GaAs wafer and can be of any size, for example, a 200 mm wafer, a 300 mm wafer, or an even larger wafer. The interface layer 102 can, for example, include a $SiO_2$ layer, a SiON layer, or a combination thereof. For example, the interface layer 102 can contain a native oxide layer formed by exposing the substrate 100 to an oxidation gas such as air or the interface layer 102 can contain a chemical oxide layer grown by a wet oxidation process. In one example, a thickness of the interface layer 102 can between about 0.5 nm and about 2 nm, or between about 0.8 nm and about 1.2 nm.

FIG. 1B schematically shows a cross-sectional view of a metal-carbon-oxygen high-k film 104 formed on the interface layer 102 by a film deposition sequence according to embodiments of the invention. The metal-carbon-oxygen high-k film 104 can, for example, contain hafnium, zirconium, titanium, rare earth elements, alkaline earth elements, or a combination thereof. However, the high-k film 104 is not limited to the above-mentioned metal elements and may contain other metal elements suitable for fabrication of advanced semiconductor devices. In one example, a thickness of the high-k film 104 can between about 1 nm and about 5 nm, or between about 1.2 nm and about 3 nm. According to another embodiment of the invention, the interface layer 102 may be removed from the substrate 100 prior to depositing the metal-carbon-oxygen high-k film 104.

According to embodiments of the invention, the film structure depicted in FIG. 1B is further processed to manufacture a semiconductor device. The further processing includes depositing additional films on the metal-carbon-oxygen high-k film 104 and lithographically patterning the resulting film structure. FIG. 1C schematically shows a cross-sectional view of a gate structure containing a patterned gate electrode film 116 formed on a patterned metal-carbon-oxygen high-k film 114 and on a patterned interface layer 112 according to an embodiment of the invention. According to another embodiment of the invention, the patterning process may stop on the interface layer 102. The patterned gate electrode film 116 can, for example, have a thickness between about 5 nm and about 10 nm and can contain poly-Si, a metal, or a metal-containing material, including W, WN, $WSi_x$, Al, Mo, Ta, TaN, TaSiN, HfN, HfSiN, Ti, TiN, TiSiN, MoN, Re, Pt, or Ru. According to other embodiments of the invention, the patterned gate electrode film 116 can be a doped hafnium zirconium nitride (doped HfZrN) film or a doped hafnium zirconium oxynitride (doped HfZrON) film. Examples of dopants include lanthanum (La), yttrium (Y), barium (Ba), strontium (Sr), lutetium (Lu), erbium (Er), dysprosium (Dy), calcium (Ca), and magnesium (Mg). FIG. 1C further shows doped regions 108 and 110 (e.g., source and drain) in the substrate 100. As those skilled in the art will readily realize, the gate structure depicted in FIG. 1C may include different and fewer or more films or layers than shown in FIG. 1C.

Figure 2:
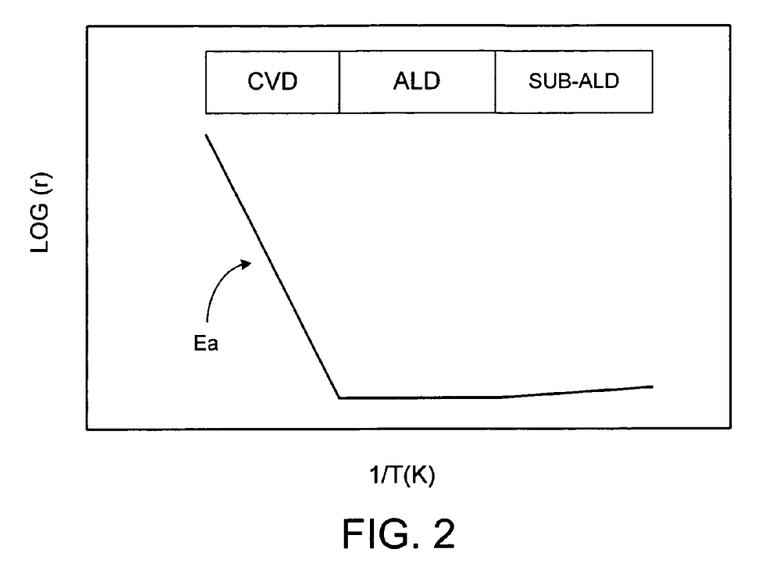
FIG. 2 schematically shows film deposition rate as a function of substrate temperature according to an embodiment of the invention.

FIG. 2 schematically shows film deposition rate as a function of substrate temperature according to an embodiment of the invention. The Arrhenius graph shows log (film deposition rate (r)) as a function of 1/temperature (($\log r = ((-Ea/k)*1/T) + \text{constant}$), where Ea is activation energy of the deposition process, k is Boltzman factor, and T is the substrate temperature in Kelvin). A CVD region can be determined using the Arrhenius graph depicted in FIG. 2. The CVD region is observed where the metal-carbon precursor thermally decomposes on the substrate with an activation energy Ea and the film deposition rate and resulting film thickness are proportional to the metal-carbon precursor exposure. At substrate temperatures below the CVD region, an ALD region is observed where the metal-carbon precursor reacts with surface sites on the substrate in a self-saturating way as depicted below in FIG. 3. At substrate temperatures below the ALD region, a sub-ALD region is depicted where the metal-carbon precursor adsorbs on the substrate in a self-saturating way with less decomposition of the metal-carbon precursor than in the ALD region. The transition between the ALD region and the sub-ALD region is often not abrupt and may be a gradual transition. In one example, a transition from an ALD region to the sub-ALD region may be identified by a substantial increase of contaminants in the film, even for ozone exposures that greatly exceed ozone self-saturation.

Figure 3:
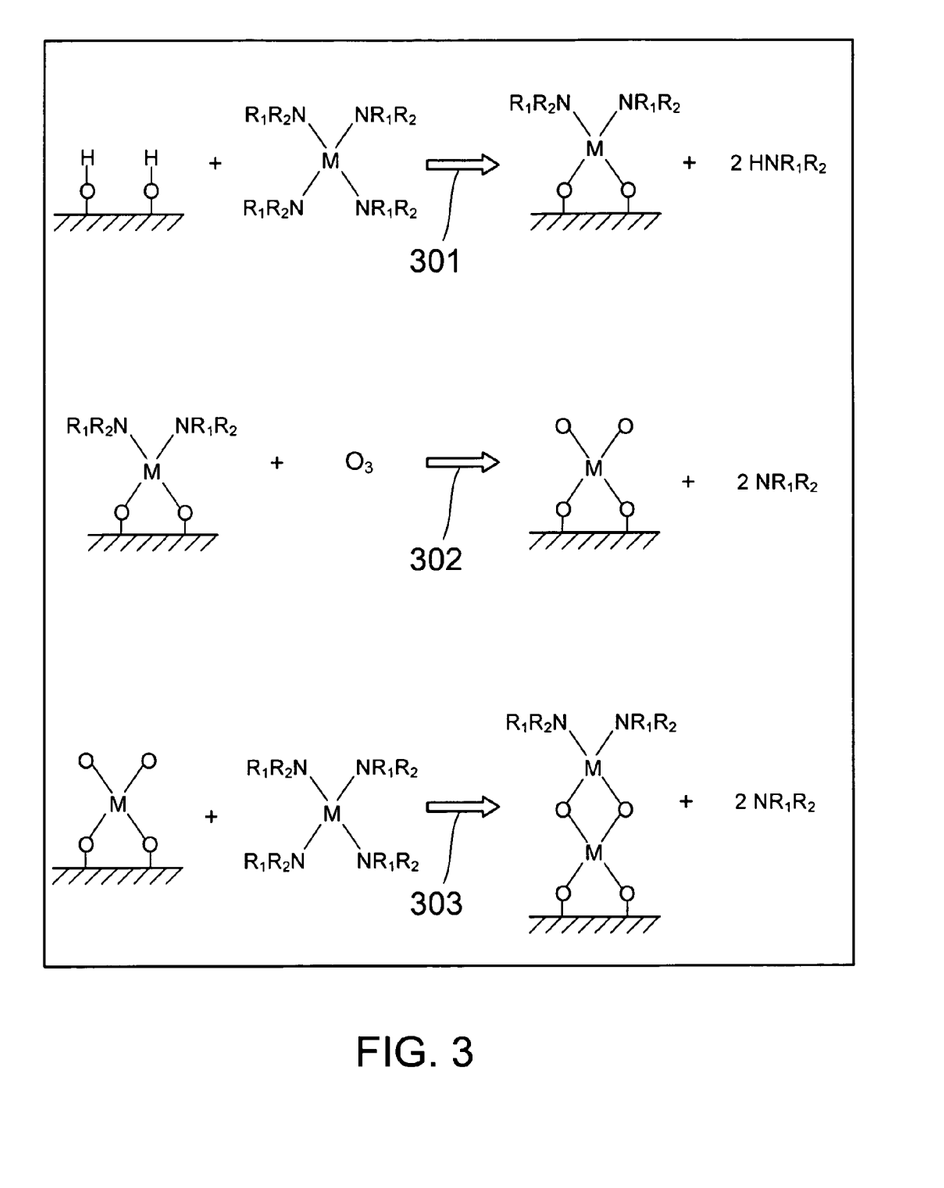
FIG. 3 depicts a simplified reaction mechanism for formation of a high-k film on a substrate according to an embodiment of the invention.

FIG. 3 depicts a simplified reaction mechanism for formation of a high-k film on a substrate according to an embodiment of the invention. The simplified reaction mechanism shows formation of an exemplary high-k film from alternating and sequential exposures of a metal-carbon precursor and ozone in an ALD region. Although not depicted in FIG. 3, the high-k film further contains carbon impurities from limited dissociation of the ligands of the metal-carbon precursor.

Step 301 includes exposing a hydroxilated (—OH terminated) starting substrate surface in a process chamber to a gaseous first reactant containing a metal-carbon precursor. In FIG. 3, the exemplary metal-carbon precursor is $M(NR_1R_2)_4$ (e.g., $Zr(NEtMe)_4$, tetrakis(ethylmethylamido) zirconium, TEMAZ). The length of exposure of the first reactant is selected such the metal-carbon precursor reacts with the —OH groups to saturate the substrate surface with chemisorbed metal-carbon precursor in a layer containing the metal element M on the available surface sites. A by-product of this reaction is HNEtMe. The amount of metal-carbon precursor that can be bound to the surface is determined by the number of available binding sites and by the physical size of the chemisorbed species (including ligands $R_1$ and $R_2$). Therefore, the substrate coverage of the chemisorbed layer is typically less than one complete monolayer of metal M, often less than about 0.5 monolayer, due to steric hindrances and possible limited number of reactive surface sites. The chemisorbed layer left by the exposure (gas pulse) of the metal-carbon precursor is self-saturated with a surface that is substantially non-reactive with the remaining metal-carbon precursor of the exposure. This phenomenon is referred to as "self-saturation".

After inert gas purging of the excess metal-carbon precursor and by-products from the process chamber, the surface is exposed to a second reactant containing ozone in step 302 where the ozone reacts with the chemisorbed metal-carbon precursor from step 301 to form a metal-carbon-oxygen film. A by-product of this reaction is NEtMe. According to embodiments of the invention, the ozone exposure in step 302 can be between below self-saturation of ozone (e.g., 70, 75, 80, 85, 90, or 95% self-saturation) and about 300% self-saturation of ozone reacting with the self-saturated metal-carbon precursor on the surface of the substrate.

After inert gas purging, the surface is ready for the next exposure of the gaseous first reactant in step 303. Subsequently, steps 302 and 303 are repeated until the metal-carbon-oxygen film has a desired thickness.

Figure 4:
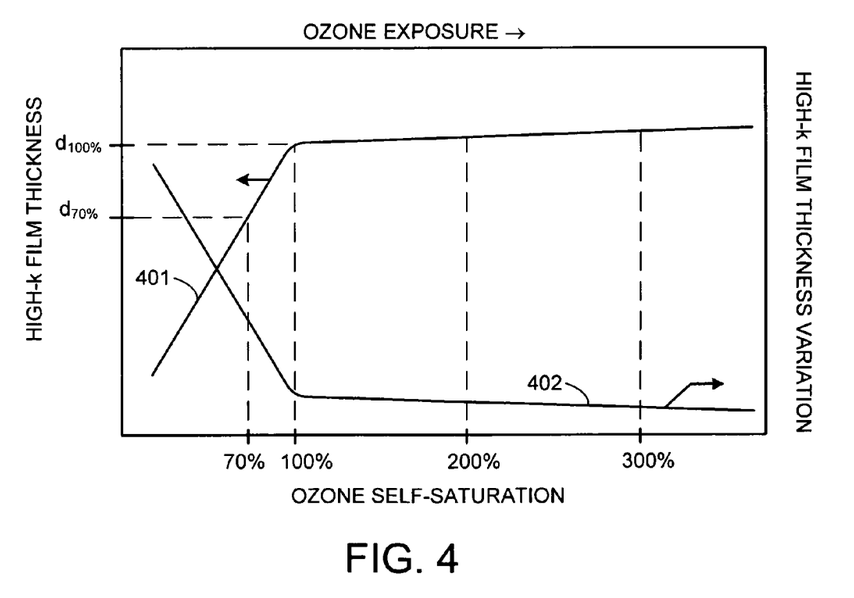
FIG. 4 shows thickness and thickness variations of high-k films as a function of ozone self-saturation according to an embodiment of the invention.

FIG. 4 shows thickness and thickness variations of high-k films as a function of ozone self-saturation according to an embodiment of the invention. The metal-carbon-oxygen high-k films were deposited using a film deposition sequence of a first reactant containing a metal-carbon precursor and a second reactant containing ozone in temporally separated and alternating reactant pulses. The first reactant exposure was selected to achieve self-saturation of the metal-carbon precursor on a surface of a substrate and the second reactant exposure was varied from between below self-saturation to above self-saturation of ozone reacting with the self-saturated metal-carbon precursor on the surface of the substrate. The self-saturation of the metal-carbon precursor can, for example, be determined by measuring the metal-carbon-oxygen high-k film thickness using ozone exposures that are in excess of ozone self-saturation and varying the first reactant exposure.

In FIG. 4, the film thickness curve 401 was obtained by measuring the thickness (d) of plurality of metal-carbon-oxygen high-k films formed on substrates for different ozone exposures. Furthermore, the film thickness variations curve 402 was obtained by measuring the film thickness at multiple locations on a substrate. Ozone self-saturation (100%) may be determined from the break in the curve 401, corresponding to a thickness $d_{100\%}$. Once the ozone exposure corresponding to ozone self-saturation was determined, ozone exposures corresponding to 70%, 200%, 300%, etc, ozone self-saturation was determined. For example, 70% ozone self-saturation corresponds to an ozone exposure that is 70% of an ozone exposure needed for 100% ozone self-saturation, and 300% ozone self-saturation corresponds to an ozone exposure that is 3 times the ozone exposure needed for 100% ozone self-saturation.

In one example, an ozone exposure may be expressed as an amount of $O_3$ exposed to a surface area of a substrate (e.g., moles $O_3$/substrate surface area). Ozone gas may be generated by an ozone generator, for example a remote plasma system configured to excite $O_2$ gas to form a mixture containing $O_3$ and $O_2$ gas. An exemplary $O_3+O_2$ mixture contains about 5% $O_3$, balance $O_2$. Commercial ozone generators are widely available and well known to those skilled in the art.

The ozone concentration generated by an ozone generator is frequently provided by the manufacturer and the ozone exposure can then be calculated from the product of the ozone concentration and exposure time exposure, divided by the surface area of the substrate exposed to the ozone gas.

FIG. 4 further shows that the film thickness variations in curve 402 decrease with increasing ozone exposure, with a break in the curve 402 at the ozone self-saturation (100%) exposure. Therefore, high-k films with good film thickness uniformity were obtained near or at the ozone self-saturation exposure.

Figure 5A:
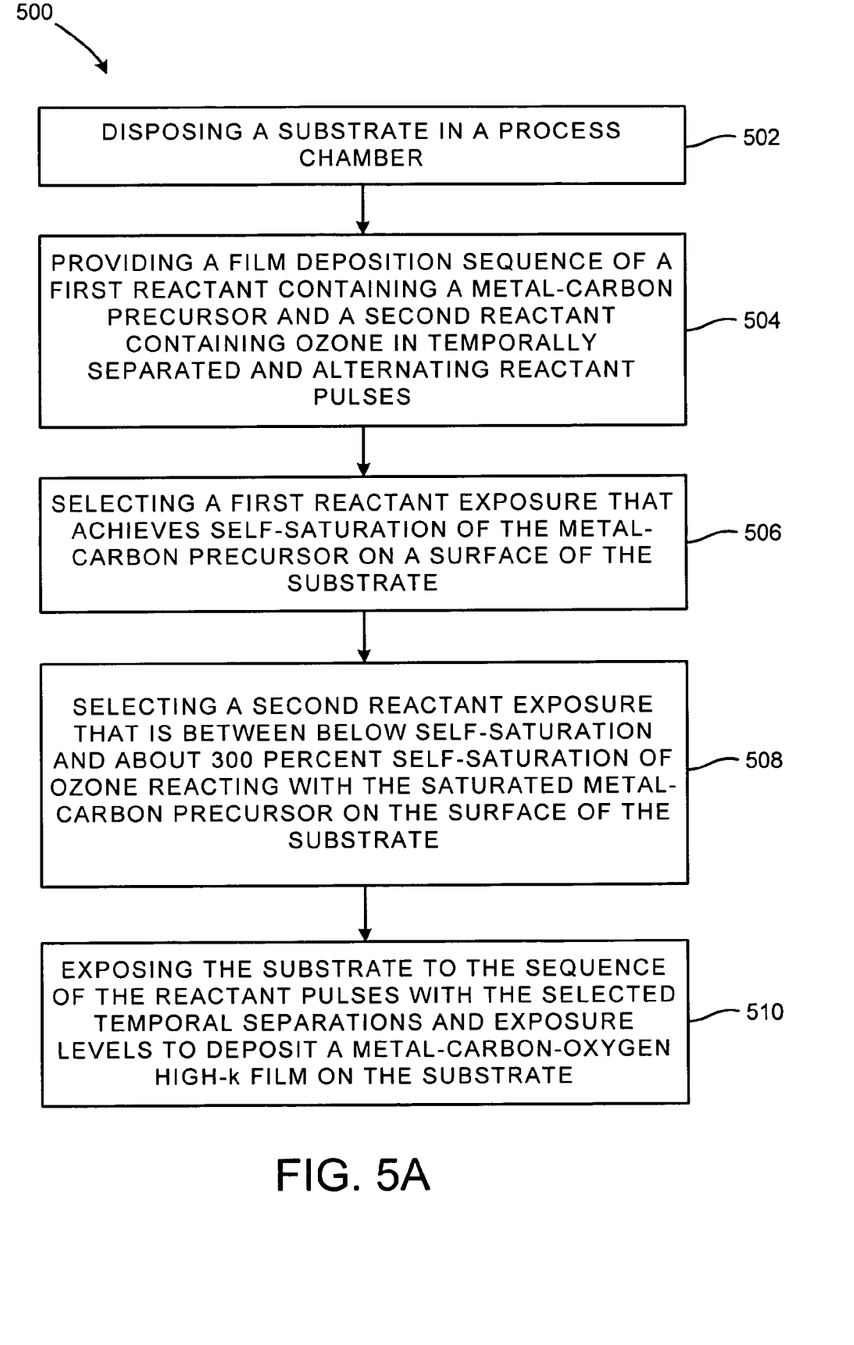
FIG. 5A is a process flow diagram for forming a high-k film according to an embodiment of the invention.

FIG. 5A is a process flow diagram for forming a high-k film according to an embodiment of the invention. The process flow of FIG. 5A may be performed by a film deposition system 1 depicted in FIG. 6, or any other suitable processing system configured to perform a film deposition process. In FIG. 5A, the process flow 500 begins when a substrate, such as a semiconductor substrate, is disposed in a process chamber of a film deposition system in block 502.

In block 504, a film deposition sequence is provided. The film deposition sequence includes a first reactant containing a metal-carbon precursor and a second reactant containing ozone in temporally separated and alternating reactant pulses. According to some embodiments of the invention, the metal-carbon precursor can contain hafnium, zirconium, titanium, or a combination thereof. The metal-carbon precursor can, for example, contain a hafnium amide, a zirconium amide, or a titanium amide, including $Hf(NEt_2)_4$ (tetrakis(diethylamido)hafnium, TDEAH), $Hf(NEtMe)_4$ (tetrakis(ethylmethylamido)hafnium, TEMAH), $Hf(NMe_2)_4$ (tetrakis(dimethylamido)hafnium, TDMAH), $Zr(NEt_2)_4$ (tetrakis(diethylamido)zirconium, TDEAZ), $Zr(NMeEt)_4$ (tetrakis(ethylmethylamido)zirconium, TEMAZ), $Zr(NMe_2)_4$ (tetrakis(dimethylamido)zirconium, TDMAZ), $Ti(NEt_2)_4$ (tetrakis(diethylamido)titanium, TDEAT), $Ti(NMeEt)_4$ (tetrakis(ethylmethylamido)titanium, TEMAT), or $Ti(NMe_2)_4$ (tetrakis(dimethylamido)titanium, TDMAT), or a combination thereof.

Other metal-carbon precursors include $Hf(O^tBu)_4$ (hafnium tert-butoxide, HTB), $Zr(O^tBU)_4$ (zirconium tert-butoxide, ZTB), $Ti(N^iPr_2)_4$, $Ti(N^iPr_2)_3$, tris(N,N'-dimethylacetamidinato)titanium, $ZrCp_2Me_2$, $Zr(^tBuCp)_2Me_2$, $Zr(N^iPr_2)_4$, $Ti(O^iPr)_4$, $Ti(O^tBu)_4$ (titanium tert-butoxide, TTB), and $Ti(THD)_3$ (tris(2,2,6,6-tetramethyl-3,5-heptanedionato)titanium).

Other embodiments of the inventions may utilize a wide variety of different alkaline earth precursors. For example, many alkaline earth precursors have the formula:

$$ML^1L^2D_x$$

where M is an alkaline earth metal element selected from the group of beryllium (Be), magnesium (Mg), calcium (Ca), strontium (Sr), and barium (Ba). $L^1$ and $L^2$ are individual anionic ligands, and D is a neutral donor ligand where x can be 0, 1, 2, or 3. Each $L^1$, $L^2$ ligand may be individually selected from the groups of alkoxides, halides, aryloxides, amides, cyclopentadienyls, alkyls, silyls, amidinates, β-diketonates, ketoiminates, silanoates, and carboxylates. D ligands may be selected from groups of ethers, furans, pyridines, pyroles, pyrolidines, amines, crown ethers, glymes, and nitriles.

Examples of L group alkoxides include tert-butoxide, isopropoxide, ethoxide, 1-methoxy-2,2-dimethyl-2-propionate (mmp), 1-dimethylamino-2,2'-dimethyl-propionate, amyloxide, and neo-pentoxide. Examples of halides include fluoride, chloride, iodide, and bromide. Examples of aryloxides include phenoxide and 2,4,6-trimethylphenoxide. Examples of amides include bis(trimethylsilyl)amide di-tert-butylamide, and 2,2,6,6-tetramethylpiperidide (TMPD). Examples of cyclepentadienyls include cyclopentadienyl, 1-methylcyclopentadienyl, 1,2,3,4-tetramethylcyclopentadienyl, 1-ethylcyclopentadienyl, pentamethylcyclopentadienyl, 1-isopropylcyclopentadienyl, 1-n-propylcyclopentadienyl, and 1-n-butylcyclopentadienyl. Examples of alkyls include bis(trimethylsilyl)methyl, tris(trimethylsilyl)methyl, and trimethylsilylmethyl. An example of a silyl is trimethylsilyl. Examples of amidinates include N,N'-di-tert-butylacetamidinate, N,N'-di-iso-propylacetamidinate, N,N'-di-isopropyl-2-tert-butylamidinate, and N,N'-di-tert-butyl-2-tert-butylamidinate. Examples of β-diketonates include 2,2,6,6-tetramethyl-3,5-heptanedionate (THD), hexafluoro-2,4-pentanedionate (hfac), and 6,6,7,7,8,8,8-heptafluoro-2,2-dimethyl-3,5-octanedionate (FOD). An example of a ketoiminate is 2-iso-propylimino-4-pentanonate. Examples of silanoates include tri-tert-butylsiloxide and triethylsiloxide. An example of a carboxylate is 2-ethylhexanoate.

Examples of D ligands include tetrahydrofuran, diethylether, 1,2-dimethoxyethane, diglyme, triglyme, tetraglyme, 12-Crown-6, 10-Crown-4, pyridine, N-methylpyrolidine, triethylamine, trimethylamine, acetonitrile, and 2,2-dimethylpropionitrile.

Representative examples of alkaline earth precursors include:

Be precursors: $Be(N(SiMe_3)_2)_2$, $Be(TMPD)_2$, and $BeEt_2$.

Mg precursors: $Mg(N(SiMe_3)_2)_2$, $Mg(TMPD)_2$, $Mg(PrCp)_2$, $Mg(EtCp)_2$, and $MgCp_2$.

Ca precursors: $Ca(N(SiMe_3)_2)_2$, $Ca(^iPr_4Cp)_2$, and $Ca(Me_5Cp)_2$.

Sr precursors: Bis(tert-butylacetamidinato)strontium (TBAASr), Sr-C, Sr-D, $Sr(N(SiMe_3)_2)_2$, $Sr(THD)_2$, $Sr(THD)_2(tetraglyme)$, $Sr(^iPr_4Cp)_2$, $Sr(^iPr_3Cp)_2$, and $Sr(Me_5Cp)_2$.

Ba precursors: Bis(tert-butylacetamidinato)barium (TBAABa), Ba-C, Ba-D, $Ba(N(SiMe_3)_2)_2$, $Ba(THD)_2$, $Ba(THD)_2(tetraglyme)$, $Ba(^iPr_4Cp)_2$, $Ba(Me_5Cp)_2$, and $Ba(nPrMe_4Cp)_2$.

Other embodiments of the inventions may utilize a wide variety of different rare earth precursors. For example, many rare earth precursors have the formula:

$$ML^1L^2L^3D_x$$

where M is a rare earth metal element selected from the group of scandium (Sc), yttrium (Y), lutetium (Lu), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), and ytterbium (Yb). $L^1$, $L^2$, $L^3$ are individual anionic ligands, and D is a neutral donor ligand where x can be 0, 1, 2, or 3. Each $L^1$, $L^2$, $L^3$ ligand may be individually selected from the groups of alkoxides, halides, aryloxides, amides, cyclopentadienyls, alkyls, silyls, amidinates, β-diketonates, ketoiminates, silanoates, and carboxylates. D ligands may be selected from groups of ethers, furans, pyridines, pyroles, pyrolidines, amines, crown ethers, glymes, and nitriles.

Examples of L groups and D ligands are identical to those presented above for the alkaline earth precursor formula.

Representative examples of rare earth precursors include:

Y precursors: $Y(N(SiMe_3)_2)_3$, $Y(N(^iPr)_2)_3$, $Y(N(^tBu)SiMe_3)_3$, $Y(TMPD)_3Cp_3Y$, $(MeCp)_3Y$, $((nPr)Cp)_3Y$, $(nBu)Cp)_3Y$, $Y(OCMe_2CH_2NMe_2)_3$, $Y(THD)_3$, $Y[OOCCH(C_2H_5)C_4H_9]_3$, $Y(C_{11}H_{19}O_2)_3CH_3(OCH_2CH_2)_3OCH_3$, $Y(CF_3COCHCOCF_3)_3$, $Y(OOCC_{10}H_7)_3$, $Y(OOC_{10}H_{19})_3$, and $Y(O(^iPr))_3$.

La precursors: $La(N(SiMe_3)_2)_3$, $La(N(^iPr)_2)_3$, $La(N(^tBu)SiMe_3)_3$, $La(TMPD)_3$, $((^iPr)Cp)_3La$, $Cp_3La$, $Cp_3La(NCCH_3)_2$, $La(Me_2NC_2H_4Cp)_3$, $La(THD)_3$, $La[OOCCH(C_2H_5)C_4H_9]_3$, $La(C_{11}H_{19}O_2)_3.CH_3(OCH_2CH_2)_3OCH_3$, $La(C_{11}H_{19}O_2)_3.CH_3(OCH_2CH_2)_4OCH_3$, $La(O(^iPr))_3$, $La(OEt)_3$, $La(acac)_3$, $La(((^tBu)_2N)_2CMe)_3$, $La(((^iPr)_2N)_2CMe)_3$, $La(((^tBu)_2N)_2C(tBu))_3$, $La(((^iPr)_2N)_2C(tBu))_3$, and $La(FOD)_3$.

Ce precursors: $Ce(N(SiMe_3)_2)_3$, $Ce(N(^iPr)_2)_3$, $Ce(N(^tBu)SiMe_3)_3$, $Ce(TMPD)_3$, $Ce(FOD)_3$, $((^iPr)Cp)_3Ce$, $Cp_3Ce$, $Ce(Me_4Cp)_3$, $Ce(OCMe_2CH_2NMe_2)_3$, $Ce(THD)_3$, $Ce[OOCCH(C_2H_5)C_4H_9]_3$, $Ce(C_{11}H_{19}O_2)_3.CH_3(OCH_2CH_2)_3OCH_3$, $Ce(C_{11}H_{19}O_2)_3.CH_3(OCH_2CH_2)_4OCH_3$, $Ce(O(iPr))_3$, and $Ce(acac)_3$.

Pr precursors: $Pr(N(SiMe_3)_2)_3$, $((^iPr)Cp)_3Pr$, $Cp_3Pr$, $Pr(THD)_3$, $Pr(FOD)_3$, $(C_5Me_4H)_3Pr$, $Pr[OOCCH(C_2H_5)C_4H_9]_3$, $Pr(C_{11}H_{19}O_2)_3$. $CH_3(OCH_2CH_2)_3OCH_3$, $Pr(O(^iPr))_3$, $Pr(acac)_3$, $Pr(hfac)_3$, $Pr(((^tBu)_2N)_2CMe)_3$, $Pr(((^iPr)_2N)_2CMe)_3$, $Pr(((^tBu)_2N)_2C(^tBu))_3$, and $Pr(((^iPr)_2N)_2C(^tBu))_3$.

Nd precursors: $Nd(N(SiMe_3)_2)_3$, $Nd(N(^iPr)_2)_3$, $((^iPr)Cp)_3Nd$, $Cp_3Nd$, $(C_5Me_4H)_3Nd$, $Nd(THD)_3$, $Nd[OOCCH(C_2H_5)C_4H_9]_3$, $Nd(O(^iPr))_3$, $Nd(acac)_3$, $Nd(hfac)_3$, $Nd(F_3CC(O)CHC(O)CH_3)_3$, and $Nd(FOD)_3$.

Sm precursors: $Sm(N(SiMe_3)_2)_3$, $((^iPr)Cp)_3Sm$, $Cp_3Sm$, $Sm(THD)_3$, $Sm[OOCCH(C_2H_5)C_4H_9]_3$, $Sm(O(^iPr))_3$, $Sm(acac)_3$, and $(C_5Me_5)_2Sm$.

Eu precursors: $Eu(N(SiMe_3)_2)_3$, $((^iPr)Cp)_3Eu$, $Cp_3Eu$, $(Me_4Cp)_3Eu$, $Eu(THD)_3$, $Eu[OOCCH(C_2H_5)C_4H_9]_3$, $Eu(O(^iPr))_3$, $Eu(acac)_3$, and $(C_5Me_5)_2Eu$.

Gd precursors: $Gd(N(SiMe_3)_2)_3$, $((^iPr)Cp)_3Gd$, $Cp_3Gd$, $Gd(THD)_3$, $Gd[OOCCH(C_2H_5)C_4H_9]_3$, $Gd(O(^iPr))_3$, and $Gd(acac)_3$.

Tb precursors: $Tb(N(SiMe_3)_2)_3$, $((^iPr)Cp)_3Tb$, $Cp_3Tb$, $Tb(THD)_3$, $Tb[OOCCH(C_2H_5)C_4H_9]_3$, $Tb(O(^iPr))_3$, and $Tb(acac)_3$.

Dy precursors: $Dy(N(SiMe_3)_2)_3$, $((^iPr)Cp)_3Dy$, $Cp_3Dy$, $Dy(THD)_3$, $Dy[OOCCH(C_2H_5)C_4H_9]_3$, $Dy(O(^iPr))_3$, $Dy(O_2C(CH_2)_6CH_3)_3$, and $Dy(acac)_3$.

Ho precursors: $Ho(N(SiMe_3)_2)_3$, $((^iPr)Cp)_3Ho$, $Cp_3Ho$, $Ho(THD)_3$, $Ho[OOCCH(C_2H_5)C_4H_9]_3$, $Ho(O(^iPr))_3$, and $Ho(acac)_3$.

Er precursors: $Er(N(SiMe_3)_2)_3$, $((^iPr)Cp)_3Er$, $((nBu)Cp)_3Er$, $Cp_3Er$, $Er(THD)_3$, $Er[OOCCH(C_2H_5)C_4H_9]_3$, $Er(O(^iPr))_3$, and $Er(acac)_3$.

Tm precursors: $Tm(N(SiMe_3)_2)_3$, $((^iPr)Cp)_3Tm$, $Cp_3Tm$, $Tm(THD)_3$, $Tm[OOCCH(C_2H_5)C_4H_9]_3$, $Tm(O(^iPr))_3$, and $Tm(acac)_3$.

Yb precursors: $Yb(N(SiMe_3)_2)_3$, $Yb(N(^iPr)_2)_3$, $((iPr)Cp)_3Yb$, $Cp_3Yb$, $Yb(THD)_3$, $Yb[OOCCH(C_2H_5)C_4H_9]_3$, $Yb(O(^iPr))_3$, $Yb(acac)_3$, $(C_5Me_5)_2Yb$, $Yb(hfac)_3$, and $Yb(FOD)_3$.

Lu precursors: $Lu(N(SiMe_3)_2)_3$, $((^iPr)Cp)_3Lu$, $Cp_3Lu$, $Lu(THD)_3$, $Lu[OOCCH(C_2H_5)C_4H_9]_3$, $Lu(O(^iPr))_3$, and $Lu(acac)_3$.

In the above precursors, the following common abbreviations are used: Si: silicon; Me: methyl; Et: ethyl; $^iPr$: isopropyl; nPr: n-propyl; Bu: butyl; nBu: n-butyl; sBu: sec-butyl; $^iBu$: iso-butyl; $^tBu$: tert-butyl; iAm: iso-amyl; Cp: cyclopentadienyl; THD: 2,2,6,6-tetramethyl-3,5-heptanedionate; TMPD: 2,2,6,6-tetramethylpiperidide; acac: acetylacetonate; hfac: hexafluoroacetylacetonate; and FOD: 6,6,7,7,8,8,8-heptafluoro-2,2-dimethyl-3,5-octanedionate.

Still referring to FIG. 5A, in block 506, a first reactant exposure is selected that achieves self-saturation of the metal-carbon precursor on a surface of the substrate. The self-saturation of the metal-carbon precursor can, for example, be determined by measuring the film thickness using ozone exposures that are in excess of ozone self-saturation and varying the first reactant exposure.

In block 508, a second reactant exposure is selected that is between self-saturation and about 300 percent self-saturation of ozone reacting with the self-saturated metal-carbon precursor on the surface of the substrate.

In block 510, the substrate is exposed to the sequence of the reactant pulses with the selected temporal separations and exposure levels to deposit a metal-carbon-oxygen high-k film on the substrate. The alternating pulses are repeated until a metal-carbon-oxygen high-k film with a desired thickness has been deposited on the substrate. According to one embodiment of the invention, the substrate is maintained at a temperature suitable for ALD of the metal-carbon-oxygen high-k film. According to another embodiment of the invention, the substrate is maintained at a temperature below which is suitable for ALD of the metal-carbon-oxygen high-k film.

Figure 5B:
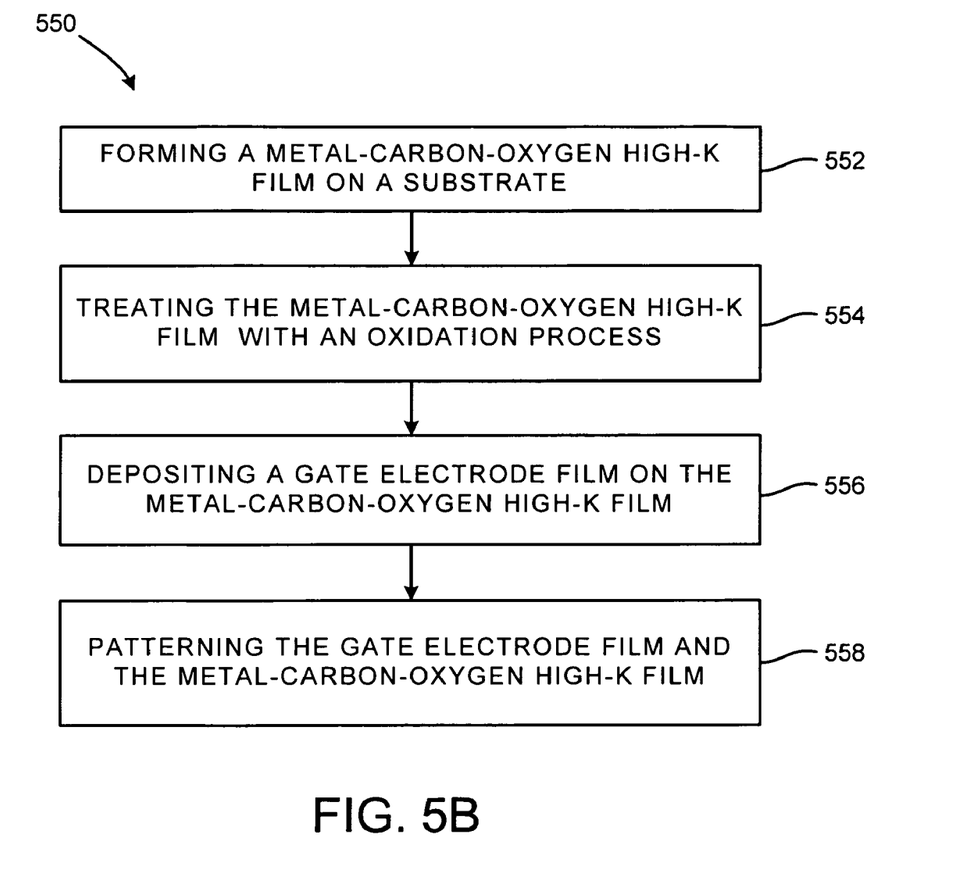
FIG. 5B is a process flow diagram for forming a gate stack according to an embodiment of the invention.

FIG. 5B is a process flow diagram for forming a gate stack according to an embodiment of the invention. In FIG. 5B, the process flow 550 begins when a metal-carbon-oxygen high-k film is formed on a substrate. The metal-carbon-oxygen high-k film can be formed as described by the process flow 500 of FIG. 5A.

In block 554, the metal-carbon-oxygen high-k film is treated with an oxidation process to effectively remove carbon and other impurities from the metal-carbon-oxygen high-k film without significantly increasing the thickness of an interface layer formed between the metal-carbon-oxygen high-k film and the substrate. In one example, the carbon-content of a metal-carbon-oxygen high-k film can be lowered from 4-6 atomic percent carbon to 2-3 atomic percent carbon by the oxidation process. This further processing improves the insulating properties and reduces electrical leakage through the metal-carbon-oxygen high-k film when the gate stack is incorporated into a semiconductor device.

In block 556, a gate electrode film is deposited on the metal-carbon-oxygen high-k film. The gate electrode film can, for example, have a thickness between about 5 nm and about 10 nm and can contain poly-Si, W, WN, $WSi_x$, Al, Mo, Ta, TaN, TaSiN, HfN, HfSiN, Ti, TiN, TiSiN, MoN, Re, Pt, or Ru.

In block 558, the gate electrode film and the metal-carbon-oxygen high-k film are patterned to form a gate stack. For example, during a photolithography process, a pattern of a gate stack can be imaged onto the photosensitive resist material by a lithography tool to provide a physical barrier during further processing of the substrate to form the gate stack. During the further processing, the lithographic pattern can be transferred into the gate electrode film and metal-carbon-oxygen high-k film by an etching process (e.g., a plasma etching process) that includes selective removal of films and layers not covered by resist.

Figure 6:
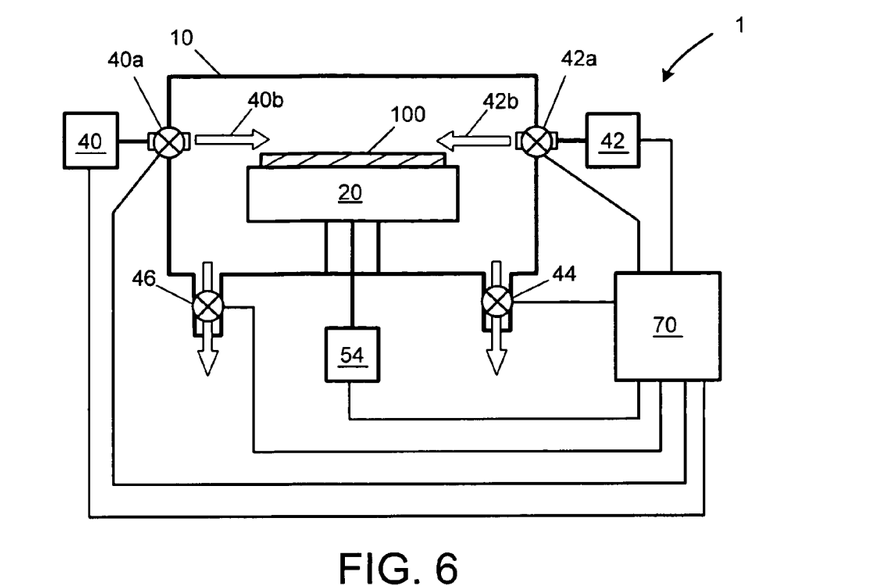
FIG. 6 is a simplified block-diagram of a film deposition system according to an embodiment of the invention.

FIG. 6 depicts a schematic view of a film deposition system according to an embodiment of the invention. The film deposition system 1 is configured to perform a film deposition sequence in an ALD region and in a sub-ALD region. The film deposition system includes a process chamber 10 having a substrate holder 20 configured to support a substrate 100, upon which a metal-carbon-oxygen high-k film is formed. The film deposition system 1 is a cross-flow system containing opposing first reactant supply system 40 configured for introducing a first reactant containing a meta-carbon precursor in the process chamber 10 and second reactant supply system 42 configured for introducing a second reactant containing ozone into the process chamber 10. As those skilled in the art will readily recognize, the first and second reactant supply systems 40, 42 can be further configured to flow an inert gas, such as a noble gas, $N_2$, or $H_2$, into the process chamber 10. Although not shown in FIG. 6, the film deposition system 1 may further contain a purge gas supply system for introducing a purge gas to the process chamber 10. The purge gas system can be coupled to the first, second, or both the first and second reactant supply systems 40, 42. For example, the introduction of the purge gas may occur between introduction of pulses of the first and second reactants to the process chamber 10. The purge gas can comprise an inert gas, such as a noble gas (i.e., He, Ne, Ar, Kr, or Xe), nitrogen ($N_2$), or hydrogen ($H_2$).

The film deposition system 1 may be configured to process 200 mm wafers, 300 mm wafers, or larger-sized wafers. In fact, it is contemplated that the film deposition system 1 may be configured to process substrates, wafers, or flat panels regardless of their size, as would be appreciated by those skilled in the art. Therefore, while aspects of the invention will be described in connection with the processing of a semiconductor substrate, the invention is not limited solely thereto.

The first reactant supply system 40 is configured to introduce a gas flow 40b of a first reactant containing a metal-carbon precursor into the process chamber 10 through a valve 40a. The first reactant is exposed to the substrate 100 and exhausted from the process chamber 10 through a valve 44 positioned opposite the valve 40a.

Several methods may be utilized for forming the gas flow 40b of the first reactant. One method includes vaporizing a metal-carbon precursor through the use of a bubbler or a direct liquid injection system. In some embodiments, the gas flow 40b may contain a plurality of different metal-carbon precursors. The plurality of different metal-carbon precursors may be vaporized in separate bubblers or direct liquid injection systems, or a combination thereof, and then mixing the vapors in the gas phase within or prior to introduction into the process chamber 10. By controlling the vaporization rate of each metal-carbon precursor separately, a desired metal element stoichiometry can be attained within the metal-carbon-oxygen high-k film. Another method of delivering each metal-carbon precursor includes separately controlling two or more different liquid sources, which are then mixed prior to entering a common vaporizer. This method may be utilized when the metal-carbon precursors are compatible in solution or in liquid form and they have similar vaporization characteristics. Other methods include the use of compatible mixed solid or liquid precursors within a bubbler. Liquid source precursors may include neat liquid metal-carbon precursors, or solid or liquid metal-carbon precursors that are dissolved in a compatible solvent. In some cases it may be possible to dissolve one or more compatible solid metal-carbon precursors in one or more compatible liquid precursors. It will be apparent to one skilled in the art that by controlling the relative concentration levels of the various precursors within a gas pulse, it is possible to deposit mixed metal-carbon-oxygen high-k films with desired stoichiometries.

The second reactant supply system 42 can include an ozone generator such as a remote plasma system (not shown) configured to excite $O_2$ gas to form a mixture containing $O_3$ and $O_2$ gas. A second reactant containing the $O_3+O_2$ mixture, herein referred to simply as $O_3$ or ozone, is then introduced into the process chamber 10 through valve 42a as gas flow 42b. The second reactant is exposed to the substrate 100 and exhausted from the process chamber 10 through a valve 46 positioned opposite the valve 42a.

The process chamber 10 is coupled to a pressure control system (not shown) to controllably evacuate the process chamber 10 through the valves 44 and 46 and maintain a reduced pressure suitable for forming a metal-carbon-oxygen high-k film on the substrate 100. The pressure control system contains a vacuum pumping system that can include a turbo-molecular vacuum pump (TMP) or a cryogenic pump. Moreover, a device for monitoring chamber pressure (not shown) can be coupled to the process chamber 10. The pressure measuring device can be, for example, an absolute capacitance manometer. The pressure control system can, for example, be configured to control the process chamber pressure between about 0.1 Torr and about 100 Torr during deposition of the high-k film.

The first and second reactant supply systems 40, 42, can include one or more pressure control devices, one or more flow control devices, one or more filters, one or more valves, and/or one or more flow sensors. The flow control devices can include pneumatic driven valves, electromechanical (solenoidal) valves, and/or high-rate pulsed gas injection valves. According to embodiments of the invention, gas flows 40b and 42b are alternately and sequentially pulsed into the process chamber 10, where the length of each gas pulse can, for example, be between about 0.1 sec and about 100 sec. Alternately, the length of each gas pulse of gas flow 40b can be between about 0.1 sec and about 10 sec, or between about 0.3 sec and about 3 sec, for example about 0.5 sec. Exemplary length of each gas pulse of gas flow 42b are between about 0.1 sec and about 3 sec, for example about 0.5 sec. Exemplary purge gas pulses can be between about 1 sec and about 20 sec, for example about 3 sec.

The film deposition system 1 includes substrate temperature control system 54 coupled to the substrate holder 20 and configured to elevate and control the temperature of substrate 100. The substrate temperature control system 54 can, for example, be configured to elevate and control the temperature of the substrate from room temperature to approximately 150° C. to 550° C. Alternatively, the temperature of the substrate can, for example, range from approximately 150° C. to 350° C. It is to be understood, however, that the temperature of the substrate 100 is selected based on the ALD or sub-ALD temperature range for a particular metal-carbon-oxygen high-k film on the surface of a given substrate. In order to improve the thermal transfer between substrate 100 and substrate holder 20, substrate holder 20 can include a mechanical clamping system, or an electrical clamping system, such as an electrostatic clamping system, to affix substrate 100 to an upper surface of substrate holder 20. Furthermore, substrate holder 20 can further include a substrate backside gas delivery system configured to introduce gas to the back-side of substrate 100 in order to improve the gas-gap thermal conductance between substrate 100 and substrate holder 20. Such a system can be utilized when temperature control of the substrate is required at elevated or reduced temperatures. For example, the substrate backside gas system can comprise a two-zone gas distribution system, wherein the helium gas gap pressure can be independently varied between the center and the edge of substrate 100.

The film deposition system 1 includes a controller 70 that is coupled to the first and second reactant supply systems 40, 42, valves 40a, 42a, 44, and 46, and substrate temperature control system 54. Alternatively, or in addition, controller 70 can be coupled to one or more additional controllers/computers (not shown), and controller 70 can obtain setup and/or configuration information from an additional controller/computer.

The controller 70 can comprise a microprocessor, memory, and a digital I/O port capable of generating control voltages sufficient to communicate and activate inputs to the film deposition system 1 as well as monitor outputs from the film deposition system 1. For example, a program stored in the memory may be utilized to activate the inputs to the aforementioned components of the film deposition system 1 according to a process recipe in order to perform a deposition process. The controller 70 can comprise a number of applications for controlling one or more of the processing elements. For example, controller 70 can include a graphic user interface (GUI) component (not shown) that can provide easy to use interfaces that enable a user to monitor and/or control one or more processing elements.

However, the controller 70 may be implemented as a general purpose computer system that performs a portion or all of the microprocessor based processing steps of the invention in response to a processor executing one or more sequences of one or more instructions contained in a memory. Such instructions may be read into the controller memory from another computer readable medium, such as a hard disk or a removable media drive. One or more processors in a multi-processing arrangement may also be employed as the controller microprocessor to execute the sequences of instructions contained in main memory. In alternative embodiments, hard-wired circuitry may be used in place of or in combination with software instructions. Thus, embodiments are not limited to any specific combination of hardware circuitry and software.

The controller 70 includes at least one computer readable medium or memory, such as the controller memory, for holding instructions programmed according to the teachings of the invention and for containing data structures, tables, records, or other data that may be necessary to implement the present invention. Examples of computer readable media are compact discs, hard disks, floppy disks, tape, magneto-optical disks, PROMs (EPROM, EEPROM, flash EPROM), DRAM, SRAM, SDRAM, or any other magnetic medium, compact discs (e.g., CD-ROM), or any other optical medium, punch cards, paper tape, or other physical medium with patterns of holes, a carrier wave (described below), or any other medium from which a computer can read.

Stored on any one or on a combination of computer readable media, resides software for controlling the controller 70, for driving a device or devices for implementing the invention, and/or for enabling the controller to interact with a human user. Such software may include, but is not limited to, device drivers, operating systems, development tools, and applications software. Such computer readable media further includes the computer program product of the present invention for performing all or a portion (if processing is distributed) of the processing performed in implementing the invention.

The computer code devices may be any interpretable or executable code mechanism, including but not limited to scripts, interpretable programs, dynamic link libraries (DLLs), Java classes, and complete executable programs. Moreover, parts of the processing of the present invention may be distributed for better performance, reliability, and/or cost.

The term "computer readable medium" as used herein refers to any medium that participates in providing instructions to the processor of the controller 70 for execution. A computer readable medium may take many forms, including but not limited to, non-volatile media, volatile media, and transmission media. Non-volatile media includes, for example, optical, magnetic disks, and magneto-optical disks, such as the hard disk or the removable media drive. Volatile media includes dynamic memory, such as the main memory. Moreover, various forms of computer readable media may be involved in carrying out one or more sequences of one or more instructions to the processor of the controller 70 for execution. For example, the instructions may initially be carried on a magnetic disk of a remote computer. The remote computer can load the instructions for implementing all or a portion of the present invention remotely into a dynamic memory and send the instructions over a network to the controller 70.

The controller 70 may be locally located relative to the film deposition system 1, or it may be remotely located relative to the film deposition system 1. For example, the controller 70 may exchange data with the film deposition system 1 using at least one of a direct connection, an intranet, the Internet and a wireless connection. The controller 70 may be coupled to an intranet at, for example, a customer site (i.e., a device maker, etc.), or it may be coupled to an intranet at, for example, a vendor site (i.e., an equipment manufacturer). Additionally, for example, the controller 70 may be coupled to the Internet. Furthermore, another computer (i.e., controller, server, etc.) may access, for example, the controller 70 to exchange data via at least one of a direct connection, an intranet, and the Internet. As also would be appreciated by those skilled in the art, the controller 70 may exchange data with the film deposition system 1 via a wireless connection.

Alternately, a batch processing system capable of processing multiple substrates simultaneously may be utilized for depositing the metal-carbon-oxygen high-k films described in the embodiments of the invention.

Figure 7:
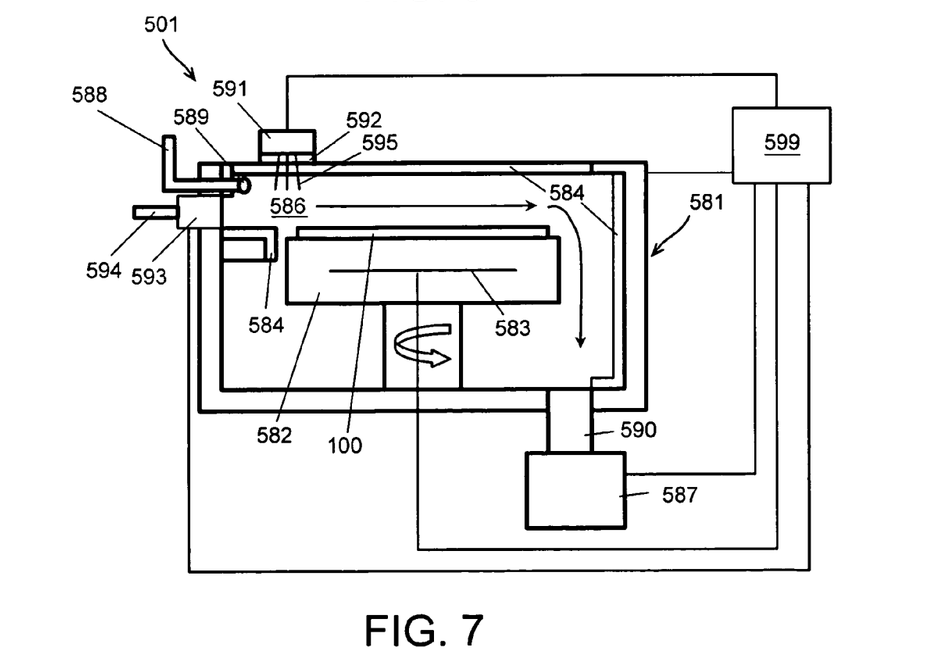
FIG. 7 is a simplified block-diagram of a processing system containing an ultra-violet (UV) radiation source for performing an oxidation process according to an embodiment of the invention.

FIG. 7 is a simplified block-diagram of a processing system containing an UV radiation source for performing an oxidation process according to an embodiment of the invention. The processing system 501 includes a process chamber 581 accommodating therein a rotatable substrate holder 582 equipped with a heater 583 that can be a resistive heater. Alternately, the heater 583 may be a lamp heater or any other type of heater. Furthermore the process chamber 581 contains an exhaust line 590 connected to the bottom portion of the process chamber 581 and to a vacuum pump 587. The substrate holder 582 can be rotated by a drive mechanism (not shown). The process chamber 581 contains a processing space 586 above the substrate 100. The inner surface of the process chamber 581 contains an inner liner 584 made of quartz in order to suppress metal contamination of the substrate 100 to be processed.

The process chamber 581 contains a gas line 588 with a nozzle 589 located opposite the exhaust line 590 for flowing a process gas containing $O_2$ over the substrate 100. The process gas flows over the substrate 100 in a processing space 586 and is evacuated from the process chamber 581 by the exhaust line 590.

The process gas supplied from the nozzle 589 is activated by UV radiation 595 generated by an UV radiation source 591 emitting UV radiation 595 through a UV transmissive window 592 (e.g., quartz) into the processing space 586 between the nozzle 589 and the substrate 100. The UV radiation source 591 is configured to generate UV radiation 595 capable of dissociating $O_2$ gas to form neutral O radicals that flow along the surface of the substrate 100, thereby exposing the substrate 100 to the neutral O radicals. Unlike during conventional plasma processing, substantially no ions are formed in the processing space 586. Commonly, UV radiation is referred to as having wavelengths between about 5 nm and about 400 nm. According to one embodiment of the invention, the UV radiation source 591 is configured to generate UV radiation with a wavelength of 172 nm. Although only one UV radiation source 591 is depicted in FIG. 7, other embodiments of the invention contemplate the use of plurality of UV radiation sources 591 above the substrate 100

Furthermore, the process chamber 581 contains a remote plasma source 593 located opposite the exhaust line 590. The remote plasma source 593 may be utilized to form neutral and ionized plasma-excited oxidation species that assist in the UV-assisted oxidation process described above. $O_2$ gas can be supplied by gas line 594 to the remote plasma source 593 for forming the plasma-excited oxidation species. The plasma-excited oxidation species flow from the remote plasma source 593 along the surface of the substrate 100, thereby exposing the substrate to the plasma-excited oxidation species.

According to one embodiment of the invention, in addition to exposing the substrate 100 to neutral O radicals generated by the UV radiation source 591, the substrate may be exposed to plasma-excited oxidation species generated by the remote plasma source 593.

Still referring to FIG. 7, a controller 599 includes a microprocessor, a memory, and a digital I/O port capable of generating control voltages sufficient to communicate and activate inputs of the processing system 501 as well as monitor outputs from the processing system 501. Moreover, the controller 599 is coupled to and exchanges information with process chamber 581, the pump 587, the heater 583, the remote plasma source 593, and the UV radiation source 591. The controller 599 may be implemented as a UNIX-based workstation. Alternately, the controller 599 can be implemented as a general-purpose computer, digital signal processing system, etc.

Further details of a processing system containing an UV radiation source are described in co-pending European Patent Application EP1453083A1, titled "NITRIDING METHOD FOR INSULATION FILM, SEMICONDUCTOR DEVICE AND PRODUCTION METHOD FOR SEMICONDUCTOR DEVICE, SUBSTRATE TREATING DEVICE AND SUBSTRATE TREATING METHOD", the entire contents of which is hereby incorporated by reference.

Figure 8:
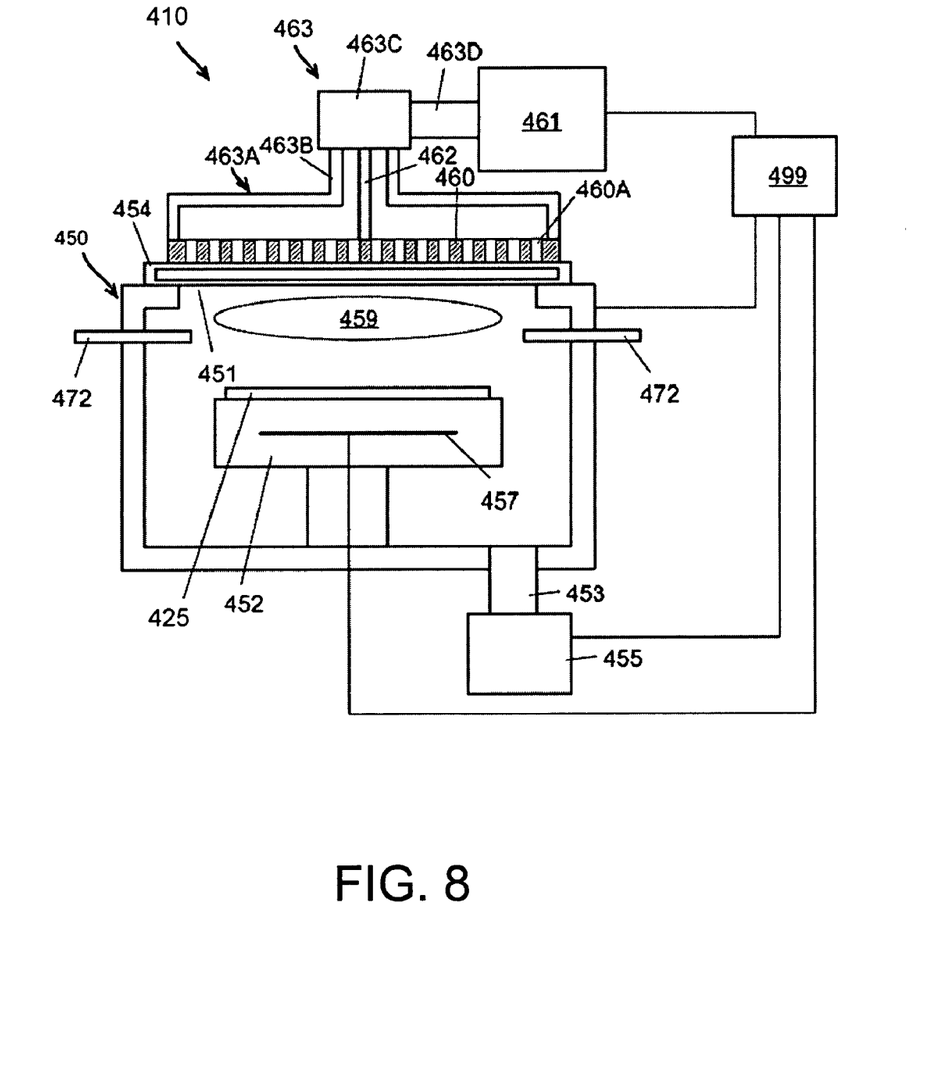
FIG. 8 is a simplified block-diagram of a plasma processing system containing a slot plane antenna (SPA) plasma source for performing an oxidation process according to one embodiment of the invention.

FIG. 8 is a simplified block-diagram of a plasma processing system containing a slot plane antenna (SPA) plasma source for performing an oxidation process according to one embodiment of the invention. The plasma produced in the plasma processing system 410 is characterized by low electron temperature and high plasma density, that enables damage-free oxidation of metal-carbon-oxygen high-k films according to embodiments of the invention. The plasma processing system 410 can, for example, be a TRIAS™ SPA processing system from Tokyo Electron Limited, Akasaka, Japan. The plasma processing system 410 contains a process chamber 450 having an opening portion 451 in the upper portion of the process chamber 450 that is larger than a substrate 425. A cylindrical dielectric top plate 454 made of quartz or aluminum nitride or aluminum oxide is provided to cover the opening portion 451. Gas lines 472 are located in the side wall of the upper portion of process chamber 450 below the top plate 454. In one example, the number of gas lines 472 can be 16 (only two of which are shown in FIG. 8). Alternately, a different number of gas lines 472 can be used. The gas lines 472 can be circumferentially arranged in the process chamber 450, but this is not required for the invention. A process gas can be evenly and uniformly supplied into the plasma region 459 in process chamber 450 from the gas lines 472.

In the plasma processing system 410, microwave power is provided to the process chamber 450 through the top plate 454 via a slot plane antenna 460 having a plurality of slots 460A. The slot plane antenna 460 can be made from a metal plate, for example copper. In order to supply the microwave power to the slot plane antenna 460, a waveguide 463 is disposed on the top plate 454, where the waveguide 463 is connected to a microwave power supply 461 for generating microwaves with a frequency of about 2.45 GHz, for example. The waveguide 463 contains a flat circular waveguide 463A with a lower end connected to the slot plane antenna 460, a circular waveguide 463B connected to the upper surface side of the circular waveguide 463A, and a coaxial waveguide converter 463C connected to the upper surface side of the circular waveguide 463B. Furthermore, a rectangular waveguide 463D is connected to the side surface of the coaxial waveguide converter 463C and the microwave power supply 461.

Inside the circular waveguide 463B, an axial portion 462 of an electroconductive material is coaxially provided, so that one end of the axial portion 462 is connected to the central (or nearly central) portion of the upper surface of slot plane antenna 460, and the other end of the axial portion 462 is connected to the upper surface of the circular waveguide 463B, thereby forming a coaxial structure. As a result, the circular waveguide 463B is constituted so as to function as a coaxial waveguide. The microwave power can, for example, be between about 0.5 W/cm$^2$ and about 4 W/cm$^2$. Alternately, the microwave power can be between about 0.5 W/cm$^2$ and about 3 W/cm$^2$. The microwave irradiation may contain a microwave frequency of about 300 MHz to about 10 GHz and the plasma may contain an electron temperature of less than about 3 eV, which includes 0.1, 0.3, 0.5, 0.7, 0.9, 1, 1.5, 2, 2.5, or 3 eV, or any combination thereof. The plasma may have a density of about $1 \times 10^{11}$/cm$^3$ to about $1 \times 10^{13}$/cm$^3$, or higher.

In addition, in the process chamber 450, a substrate holder 452 is provided opposite the top plate 454 for supporting and heating a substrate 425 (e.g., a wafer). The substrate holder 452 contains a heater 457 to heat the substrate 425, where the heater 457 can be a resistive heater. Alternately, the heater 457 may be a lamp heater or any other type of heater. Furthermore the process chamber 450 contains an exhaust line 453 connected to the bottom portion of the process chamber 450 and to a vacuum pump 455.

Still referring to FIG. 8, a controller 499 includes a microprocessor, a memory, and a digital I/O port capable of generating control voltages sufficient to communicate and activate inputs of the plasma processing system 410 as well as monitor outputs from the plasma processing system 410. Moreover, the controller 499 is coupled to and exchanges information with process chamber 450, the vacuum pump 455, the heater 457, and the microwave power supply 461. A program stored in the memory is utilized to control the aforementioned components of plasma processing system 410 according to a stored process recipe. One example of controller 499 is a UNIX-based workstation. Alternately, the controller 499 can be implemented as a general-purpose computer, digital signal processing system, etc.

During oxidation of a metal-carbon-oxygen high-k film in the plasma processing system 410, the processing conditions can include a substrate temperature between about 25° C. and about 800° C., for example about 400° C. Alternately, the substrate temperature can be between about 400° C. and about 700° C. The pressure in the process chamber 450 can, for example, be maintained between about 10 mTorr and about 10 Torr, for example about 100 mTorr. Alternately, the pressure can be maintained between about 20 mTorr and about 1 Torr. According to one embodiment of the invention, the process gas consists of O$_2$ that may be introduced into the process chamber 581 at a flow rate between about 5 sccm and about 1 slm. According to another embodiment of the invention, the process gas can consist of O$_2$ and an inert gas such as a noble gas. A flow rate of the inert gas can, for example, be between 0 sccm and about 5 slm. In one example, the process gas consists of O$_2$ and Ar. Exemplary gas exposure times are between about 5 sec and about 5 min, for example about 20 sec.

A plurality of embodiments for depositing metal-carbon-oxygen high-k films using near saturation of an ozone oxidation source in ALD and sub-ALD processing have been described. The foregoing description of the embodiments of the invention has been presented for the purposes of illustration and description. It is not intended to be exhaustive or to limit the invention to the precise forms disclosed. This description and the claims following include terms that are used for descriptive purposes only and are not to be construed as limiting. For example, the term "on" as used herein (including in the claims) does not require that a film "on" a substrate is directly on and in immediate contact with the substrate; there may be a second film or other structure between the film and the substrate.

Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A method for forming a high-dielectric constant (high-k) film for a semiconductor device, the method comprising:
   disposing a substrate in a process chamber;
   providing a film deposition sequence of a first reactant containing a metal-carbon precursor and a second reactant containing ozone in temporally separated and alternating reactant pulses, the sequence comprising:
   selecting a first reactant pulse, wherein self-saturation of the metal-carbon precursor on a surface of the substrate is achieved, and
   selecting a second reactant pulse comprising ozone, wherein below self-saturation of ozone reacting with the self-saturated metal-carbon precursor on the surface of the substrate is achieved; and
   exposing the substrate to the sequence of the reactant pulses with the selected temporal separations and exposures to deposit a conformal metal-carbon-oxygen high-k film on the substrate, wherein the conformal metal-carbon-oxygen high-k film contains metal atoms and carbon atoms from the metal-carbon precursor and oxygen from the ozone exposure, wherein the conformal metal-carbon-oxygen high-k film has 4-6 atomic percent carbon.

2. The method of claim 1, further comprising:
   forming a gate electrode film on the conformal metal-carbon-oxygen high-k film; and
   patterning the gate electrode film and the metal-carbon-oxygen high-k film.

3. The method of claim 1, wherein the first reactant comprises a hafnium precursor, a zirconium precursor, a titanium precursor, a rare-earth precursor, or an alkaline earth precursor, or a combination thereof.

4. The method of claim 1, wherein the first reactant comprises a hafnium amide precursor, a zirconium amide precursor, or a titanium amide precursor, or a combination thereof.

5. The method of claim 4, wherein the first reactant comprises Hf(NEt$_2$)$_4$ (tetrakis(diethylamido)hafnium, TDEAH), Hf(NEtMe)$_4$ (tetrakis(ethylmethylamido)hafnium, TEMAH), Hf(NMe$_2$)$_4$ (tetrakis(dimethylamido)hafnium, TDMAH), Zr(NEt$_2$)$_4$ (tetrakis(diethylamido)zirconium, TDEAZ), Zr(NMeEt)$_4$ (tetrakis(ethylmethylamido)zirconium, TEMAZ), Zr(NMe$_2$)$_4$ (tetrakis(dimethylamido)zirconium, TDMAZ), Ti(NEt$_2$)$_4$ (tetrakis(diethylamido)titanium, TDEAT), Ti(NMeEt)$_4$ (tetrakis(ethylmethylamido)titanium, TEMAT), and Ti(NMe$_2$)$_4$ (tetrakis(dimethylamido)titanium, TDMAT), or a combination of two or more thereof.

6. The method of claim 1, wherein selecting the second reactant exposure comprises:
depositing a plurality of metal-carbon-oxygen high-k films using different second reactant exposures;
measuring thicknesses of the plurality of metal-carbon-oxygen high-k films;
constructing a graph of the thicknesses of the plurality of metal-carbon-oxygen high-k films as a function of the different second reactant exposures; and
determining the self-saturation of ozone from the graph.

7. The method of claim 1, wherein the substrate is maintained at a temperature suitable for atomic layer deposition (ALD) of the conformal metal-carbon-oxygen high-k film.

8. The method of claim 1, wherein the substrate is maintained at a temperature below which is suitable for atomic layer deposition (ALD) of the conformal metal-carbon-oxygen high-k film.

9. A method for forming a high-dielectric constant (high-k) film for a semiconductor device, the method comprising:
disposing a substrate in a process chamber;
providing a film deposition sequence of a first reactant containing a metal-carbon precursor and a second reactant containing ozone in temporally separated and alternating reactant pulses, the providing comprising:
selecting a first reactant exposure that achieves self-saturation of the metal-carbon precursor on a surface of the substrate, and
selecting a second reactant exposure comprising ozone that is below self-saturation of ozone reacting with the self-saturated metal-carbon precursor on the surface of the substrate;
exposing the substrate to the sequence of the reactant pulses with the selected temporal separations and exposures to deposit a conformal metal-carbon-oxygen high-k film on the substrate, wherein the conformal metal-carbon-oxygen high-k film contains metal atoms and carbon atoms from the metal-carbon precursor and oxygen from the ozone exposure, wherein the conformal metal-carbon-oxygen high-k film has 4-6 atomic percent carbon; and
exposing the conformal metal-carbon-oxygen high-k film to a flow of O$_2$ gas excited by ultra-violet radiation to reduce a carbon-content of the conformal metal-carbon-oxygen high-k film.

10. The method of claim 9, wherein the substrate is maintained at a temperature suitable for atomic layer deposition (ALD) of the conformal metal-carbon-oxygen high-k film.

11. The method of claim 9, wherein the substrate is maintained at a temperature below which is suitable for atomic layer deposition (ALD) of the conformal metal-carbon-oxygen high-k film.

12. The method of claim 9, wherein the exposing the conformal metal-carbon-oxygen high-k film further comprises exposing the conformal metal-carbon-oxygen high-k film to plasma excited oxidation species from a remote plasma source.

13. A method for forming a high-dielectric constant (high-k) film for a semiconductor device, the method comprising:
disposing a substrate in a process chamber;
providing a film deposition sequence of a first reactant containing a metal-carbon precursor and a second reactant containing ozone in temporally separated and alternating reactant pulses, the providing comprising:
selecting a first reactant exposure that achieves self-saturation of the metal-carbon precursor on a surface of the substrate, and
selecting a second reactant exposure comprising ozone that is below self-saturation of ozone reacting with the self-saturated metal-carbon precursor on the surface of the substrate;
exposing the substrate to the sequence of the reactant pulses with the selected temporal separations and exposures to deposit a conformal metal-carbon-oxygen high-k film on the substrate, wherein the conformal metal-carbon-oxygen high-k film contains metal atoms and carbon atoms from the metal-carbon precursor and oxygen from the ozone exposure, wherein the conformal metal-carbon-oxygen high-k film has 4-6 atomic percent carbon; and
exposing the conformal metal-carbon-oxygen high-k film to a process gas containing O$_2$ gas excited by plasma induced dissociation based on microwave irradiation via a plane antenna member having a plurality of slots to reduce a carbon-content of the conformal metal-carbon-oxygen high-k film.

14. The method of claim 13, wherein the substrate is maintained at a temperature suitable for atomic layer deposition (ALD) of the conformal metal-carbon-oxygen high-k film.

15. The method of claim 13, wherein the substrate is maintained at a temperature below which is suitable for atomic layer deposition (ALD) of the conformal metal-carbon-oxygen high-k film.

16. The method of claim 9, wherein exposing the conformal metal-carbon-oxygen high-k film to a flow of O$_2$ gas excited by ultra-violet radiation reduces the carbon-content of the conformal metal-carbon-oxygen high-k film to 2-3 atomic percent carbon.

17. The method of claim 13, wherein exposing the conformal metal-carbon-oxygen high-k film to a flow of O$_2$ gas excited by plasma induced dissociation based on microwave irradiation via a plane antenna member having a plurality of slots reduces the carbon-content of the conformal metal-carbon-oxygen high-k film to 2-3 atomic percent carbon.

* * * * *